US012810048B2

(12) United States Patent
Nalamalpu et al.

(10) Patent No.: US 12,810,048 B2
(45) Date of Patent: Nov. 24, 2026

(54) DIE-TO-DIE INTERCONNECT ARCHITECTURE FOR HARDWARE-AGNOSTIC MODELING

(71) Applicant: Altera Corporation, San Jose, CA (US)

(72) Inventors: Ankireddy Nalamalpu, Portland, OR (US); Mahesh K. Kumashikar, Bangalore (IN); Atul Maheshwari, Portland, OR (US); Lai Guan Tang, Tanjung Bungah (MY)

(73) Assignee: Altera Corporation, San Jose, CA (US)

( * ) Notice: Subject to any disclaimer, the term of this patent is extended or adjusted under 35 U.S.C. 154(b) by 195 days.

(21) Appl. No.: 17/956,372

(22) Filed: Sep. 29, 2022

(65) Prior Publication Data

US 2023/0042718 A1 Feb. 9, 2023

(51) Int. Cl.
*G06F 30/373* (2020.01)
*G06F 30/34* (2020.01)

(52) U.S. Cl.
CPC ............ *G06F 30/373* (2020.01); *G06F 30/34* (2020.01)

(58) Field of Classification Search
CPC ............................... G06F 30/373; G06F 30/34
USPC ........................................................ 716/106
See application file for complete search history.

(56) References Cited

U.S. PATENT DOCUMENTS 8,751,983 B1 * 6/2014 Mitchell ................. G06F 30/30 716/105
10,909,652 B2 * 2/2021 Koker ....................... G06T 1/20
11,625,523 B2 * 4/2023 Lin ...................... G11C 7/1012 716/116
12,425,030 B2 * 9/2025 Rotker ........... H03K 19/017581
2004/0019859 A1 * 1/2004 Ravi ....................... G06F 30/33 716/103
2019/0044517 A1 * 2/2019 Shumarayev ........... H04L 12/40
2019/0138680 A1 * 5/2019 Teh .................. H03K 19/17796
2022/0222194 A1 * 7/2022 Chandwani ......... G06F 13/1663
2024/0104136 A1 * 3/2024 Karlsson Rönnberg ..................... G06F 16/9024
2024/0354305 A1 * 10/2024 Sundström ........ G06F 16/24558
2024/0419844 A1 * 12/2024 Sood ..................... G06F 21/606
2025/0029971 A1 * 1/2025 Olofsson ................. H01L 25/50
2025/0110270 A1 * 4/2025 Chiu .................. G02B 6/12004
2025/0322127 A1 * 10/2025 Sheikh .................. G06F 30/394
2025/0383937 A1 * 12/2025 Sundström ............ G06F 9/5077

FOREIGN PATENT DOCUMENTS

EP 4439662 A1 * 10/2024 ......... H01L 23/5386
WO WO-2023129320 A1 * 7/2023 ......... G06F 13/4282
WO WO-2023129772 A1 * 7/2023 ......... G06F 13/4295

(Continued)

*Primary Examiner* — Suresh Memula
(74) *Attorney, Agent, or Firm* — FLETCHER YODER PC

(57) ABSTRACT

Systems or methods of the present disclosure may provide an integrated circuit system. The integrated circuit system may implement a circuit design. Design software models a circuit design for the integrated circuit system and the circuit design is agnostic of physical layer circuitry of the integrated circuit system. The design software may generate configuration data based on the circuit design and transfer the configuration data to the integrated circuit system to cause programmable logic of the integrated circuit system to implement the circuit design.

20 Claims, 5 Drawing Sheets

(56) References Cited

FOREIGN PATENT DOCUMENTS

| | | | | | |
|---|---|---|---|---|---|
| WO | WO-2023129785 | A1 * | 7/2023 | ............. | H01L 25/18 |
| WO | WO-2023146671 | A1 * | 8/2023 | ......... | G06F 13/1636 |

* cited by examiner

DIE-TO-DIE INTERCONNECT ARCHITECTURE FOR HARDWARE-AGNOSTIC MODELING

BACKGROUND

The present disclosure relates generally to modeling of die-to-die interconnect architecture for an integrated circuit system design independent of underlying hardware.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices are becoming faster and more efficient in data processing to keep up with the ever-increasing push for faster processing of large volumes of data. Some integrated circuit devices may include electronic devices that may include multiple integrated circuit dies, which are sometimes referred to as chiplets, communicatively coupled to perform data processing tasks. The multiple dies in an integrated circuit device may be programmable logic devices, application-specific integrated circuits, processors, transceivers, or a variety of other electronic circuit components.

Integrated circuit devices may be found in a wide variety of products, including computers, handheld devices, industrial infrastructure, televisions, and vehicles. Many of these integrated circuit devices are application-specific integrated circuits (ASICs) that are designed and manufactured to perform specific tasks. A programmable logic device such as a field programmable gate array (FPGA), by contrast, may be configured after manufacturing with a variety of different system designs. As such, programmable logic devices may be used for varying tasks and/or workloads. However, programmable logic devices may use different interfaces for connection and communication with other components. To generate system designs that include multiple integrated circuit dies, the die-to-die adapter layers and physical layers of all of the multiple integrated circuit dies may be modeled by software that compiles the system design. As such, to use a new integrated circuit die in a system design, a model of the new integrated circuit die may be created. This may take time and expertise, increasing the difficulty of using the new integrated circuit die in a system design.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
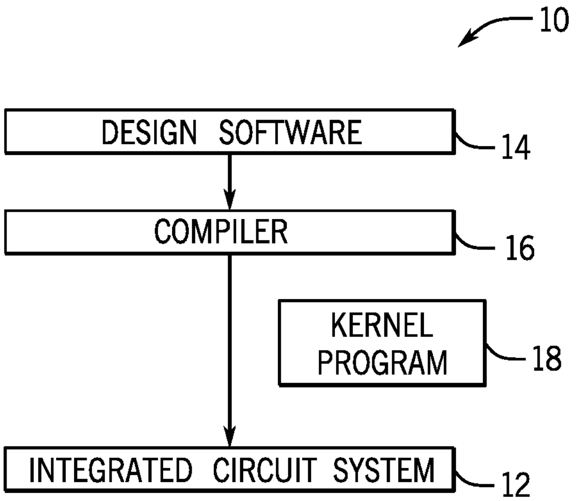
FIG. 1 is a block diagram of a process for implementing a system design on an integrated circuit system, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Programmable logic devices are increasingly permeating markets, enabling customers to implement integrated circuit system designs in logic fabric (e.g., programmable logic). Programmable logic fabric of an integrated circuit may be programmed to implement a programmable circuit design to perform a wide range of functions and operations. The programmable logic fabric may include configurable blocks of programmable logic (e.g., sometimes referred to as logic array blocks (LABs) or configurable logic blocks (CLBs)) that have lookup tables (LUTs) that can operate as different logic elements based on the configuration data programmed into memory cells in the blocks. Different system designs may use different interfaces for connection and communication with other circuit components. For example, some integrated circuit dies (e.g., chiplets) may use a specific interface (e.g., peripheral component interconnect express (PCIe)) for communication. Indeed, some integrated circuit dies may communicate using a high data bandwidth interface while others may communicate using interfaces with lower data bandwidth.

This disclosure relates to generating a system design for an integrated circuit system formed using multiple integrated circuit dies (e.g., chiplets). Such suitable integrated circuit systems may be formed, for example, by disaggregating components of a monolithic integrated circuit into chiplets that may be coupled in a three-dimensional (3D) or side-by-side (2.5D) arrangement. Although this disclosure encompasses any suitable integrated circuit systems, some specific examples of modular integrated circuit systems in the form of programmable logic devices will be discussed below. It should be appreciated that these examples are meant to be elucidatory and not exhaustive. For example, a programmable logic integrated circuit system may be formed by disaggregating one or more components of a field programmable gate array (FPGA). In some cases, the integrated circuit system may include chiplets (e.g., separate dies, tiles) that respectively contain specific circuits that historically have been part of a monolithic programmable logic device (e.g., transceivers) or custom chiplets made by a third party.

The integrated circuit system may have a main fabric die (e.g., FPGA die) with a fabric embedded with certain common functions used by broad segments of potential developers or users that may couple to chiplets with supporting circuitry (e.g., disaggregated circuit elements). Indeed, the main fabric die may include programmable logic circuitry, which may be referred to as logic array blocks (LABs) or configurable logic blocks (CLBs), and programmable routing circuitry. In some cases, the main fabric die may not include certain other circuit elements found in many monolithic programmable logic devices, such as embedded memory (e.g., M20k) blocks, digital signal processor (DSP) blocks, embedded input/output (I/O), embedded hard processor systems (HPS), or the like. In some cases, disaggregated circuitry may be referred to as FPGA memory, FPGA DSP blocks, FPGA I/O blocks, and FPGA HPS blocks, or the like, to signify that they represent circuitry suitable for use by an FPGA like circuitry that is found in a monolithic FPGA. Moreover, these disaggregated components may be disposed in separate respective chiplets (e.g., there may be separate memory chiplets, DSP chiplets, I/O (transceiver) chiplets, HPS chiplets) or may be at least partly combined in certain chiplets (e.g., there may be chiplets with both memory and DSP blocks, chiplets with I/O chiplets and HPS). Disaggregating these circuit components may cause the FPGA die to use less power to operate or operate more efficiently since the programmable logic fabric may be arranged as a continuous array. Indeed, a continuous array of programmable logic fabric may be a more efficient power and performance arrangement.

Additionally or alternatively, the one or more chiplets may implement fixed-function logic found in monolithic FPGAs, such as floating point (FP) arithmetic, a cryptographic engine, an artificial intelligence (AI) engine, or the like. The chiplets may also implement functions for off-die communication, such as functions of communication ports, input/output ports, bridges or interposers, decoupling capacitors, or the like. The chiplets may further implement processes of hardened circuits, such as processors (e.g., an x86 processor, an Advanced RISC Machines (ARM) processor, a secure device manager (SDM)), hard processor system (HPS), or the like). The chiplets may also implement voltage regulation (VR), a power source, or the like.

In an example, a market segment or a customer may want an integrated circuit system with to with a certain functionality or performance requirements. The resulting integrated circuit system may meet the desires of the market due to the arrangement of the chiplets and/or the functionality of the chiplets. For example, the relative placement of the chiplets may be selected based on an expected FPGA system design that will be configured on the programmable fabric die. The relative placement of the chiplets may also be selected so as to distribute heat based on an expected operation of the FPGA system design.

The integrated circuit system according to this disclosure may take any suitable form. One example is that of a programmable logic device that includes programmable logic circuitry (e.g., programmable logic fabric, FPGA). FIG. 1 illustrates a block diagram of a system 10 used to design and/or configure an integrated circuit system 12 (e.g., a programmable logic device, an application specific integrated circuit (ASIC), a structured ASIC, such as a via-configurable structured ASIC, eASIC™ by Intel Corporation, and so forth). A designer may implement functionality on an integrated circuit, such as an integrated circuit system 12 that includes reconfigurable circuitry, such as an FPGA. The designer may program the integrated circuit system 12 with configuration data (e.g., defining a mapping function) for a circuit design (e.g., which may include data routing between individual dies) within the system 12. A designer may implement a circuit design to be programmed onto the integrated circuit system 12, which may include multiple dies in a package, using design software 14, such as a version of QUARTUS® by INTEL CORPORATION. The design software 14 may use a compiler 16 to generate a low-level circuit-design, which may be provided as a kernel program 18, sometimes known as a program object file or bitstream, that programs the integrated circuit system 12. For example, the compiler 16 may provide machine-readable instructions representative of the circuit design to the integrated circuit system 12. For example, a programmable logic device may receive one or more programs (e.g., bitstreams) 18 that describe the hardware implementations that should be stored in the programmable logic device as a configuration program. That is, the compiler 16 may provide machine-readable instructions representative of the circuit design to the programmable logic device. The configuration data may program the entire programmable fabric of the programmable device, one or more target partitions of the programmable fabric, and/or reprogram the programmable fabric as needed.

Figure 2:
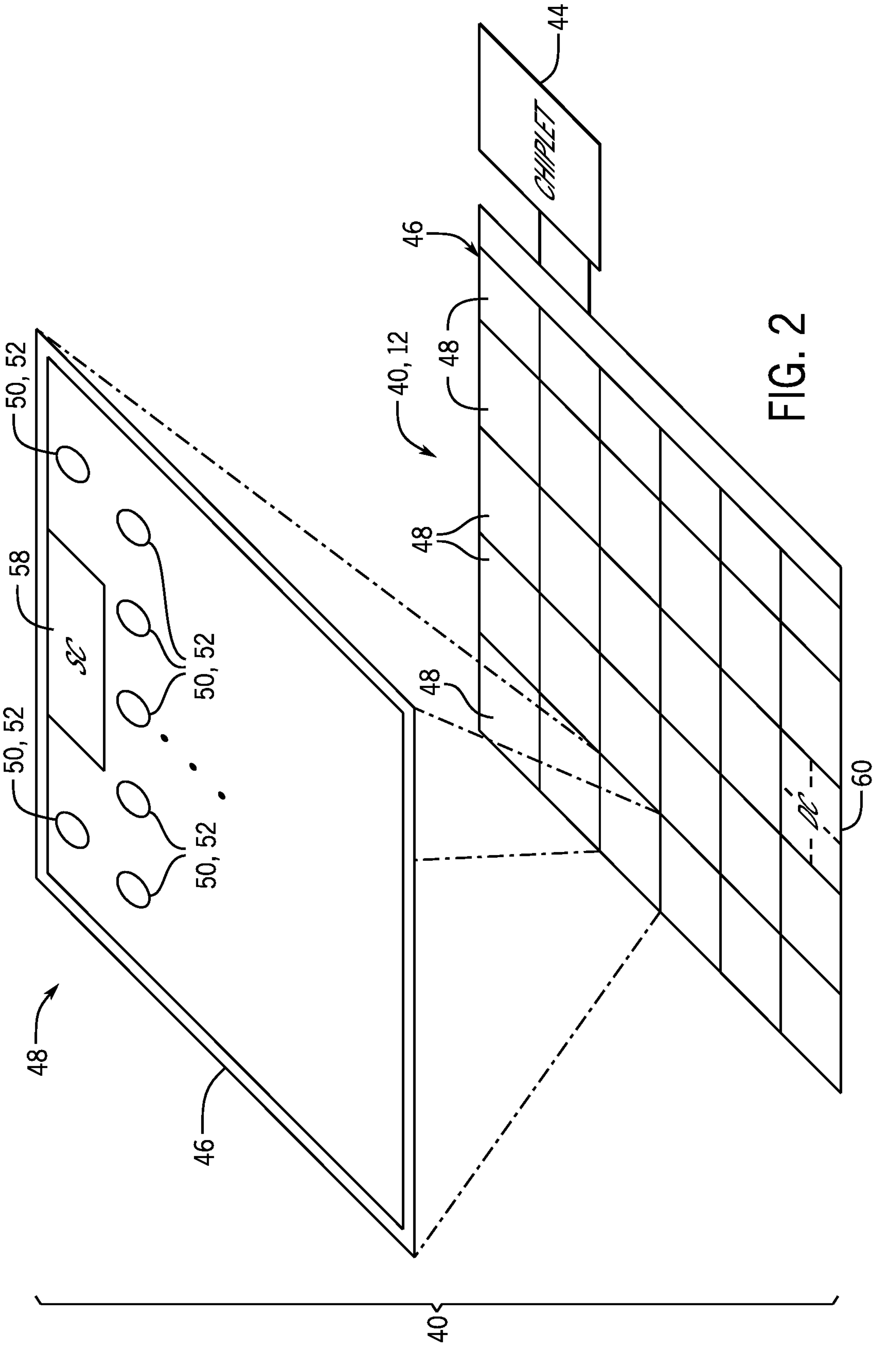
FIG. 2 is a block diagram of an example logical arrangement of the integrated circuit system of FIG. 1, in accordance with an embodiment of the present disclosure.

The integrated circuit system 12 may include any programmable logic device, such as a field programmable array (FPGA) 40, as shown in FIG. 2. For the purposes of this example, the FPGA 40 is referred to as a FPGA, though the device may be any suitable type of programmable logic device (e.g., an application-specific integrated circuit and/or application-specific standard product). The FPGA 40 may be formed on a single plane. In some embodiments, the FPGA 40 may be a three-dimensional FPGA having a fabric die and one or more other dies (e.g., a base die, chiplets, tiles).

In the example of FIG. 2, the FPGA 40 may be communicatively coupled to a chiplet 44 that may drive signals off the FPGA 40 and for receiving signals from other devices. For example, the chiplet 44 may include an I/O tile that implements a high speed I/O interface. In another example, the chiplet 44 may include a transceiver that may include and/or use input-output circuitry for driving signals off the FPGA 40 and for receiving signals from other devices. Interconnection resources 46 may be used to route signals, such as clock or data signals, through the FPGA 40. The FPGA 40 of FIG. 2 is sectorized, meaning that programmable logic resources may be distributed through a number of discrete programmable logic sectors 48. Each programmable logic sector 48 may include a number of programmable logic elements 50 having operations defined by configuration memory 52 (e.g., configuration random access memory (CRAM)). The programmable logic elements 50 may include combinational or sequential logic circuitry for performing the functionality programmed by the configuration data. For example, the programmable logic elements 50 may include look-up tables, registers, multiplexers, routing wires, and so forth. A designer may program the programmable logic elements 50 to perform a variety of desired functions.

To program the sectors 48, the configuration data associated with the circuit design may be stored in the configuration memory 52 of the appropriate programmable logic elements 50. As such, the sectors 48 and logic elements 50 may include additional logic elements to facilitate the storage of configuration data, such as wires, gates, and registers. For example, during programming, the configuration data may be loaded into data registers and subsequently into the configuration memory 52 using pins and input/output circuitry. Additionally or alternatively, a power supply may provide a source of voltage and current to a power distribution network (PDN) that distributes electrical power to the various components of the FPGA 40. Operating the circuitry of the FPGA 40 causes power to be drawn from the power distribution network.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 1, 5, 10, 50, 100, 500, 1000, 5000, 10,000, 50,000, or 100,000 sectors or more). Different programmable logic sectors 48 may include a sector controller (SC) 58 that controls the operation of the programmable logic sectors 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 may be augmented with numerous additional capabilities. For example, such capabilities may include locally sequencing reads and writes to implement error detection and correction on the configuration memory 52 and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data (e.g., mapping function) is loaded into the configuration memory 52 using pins and input/output circuitry. In one example, the configuration memory 52 may be implemented as configuration random-access-memory (CRAM) cells. As discussed below, in some embodiments, the configuration data may be loaded into the FPGA 40 using an update to microcode of the processor in which the FPGA 40 is embedded. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may be applied to the gates of metal-oxide-semiconductor (MOS) transistors that control the states of the programmable logic elements 50, or programmable components of the interconnection resources 46.

The programmable elements 50 of the FPGA 40 may also include some communication wires to transfer a signal. In an embodiment, the programmable logic sectors 48 may be provided in the form of vertical routing channels (e.g., interconnects formed along a y-axis of the FPGA 40) and horizontal routing channels (e.g., interconnects formed along an x-axis of the FPGA 40). The routing channels of the FPGA 40 may also include or interface with network-on-chip (NoC) circuitry to transmit data in packets from one address within the FPGA 40 to another address. The FPGA 40 may include one or more function blocks, which may be partial reconfiguration regions of the programmable logic elements 50 of the FPGA 40 that may be modified (e.g., partially reconfigured) to implement new logic. The function blocks may implement logic that performs a particular task, such as routing data, which may be user-defined. Data, such as communication packets, may be transferred between the function blocks and/or the interconnection resources 46 of the FPGA 40. Further, the interconnection resources 46 may enable data to be transmitted and received by the FPGA 40. As further described herein, data may be communicated between dies of the integrated circuit system 12. Keeping the discussion of FIG. 1 and FIG. 2 in mind, a user (e.g., a designer) may utilize the design software 14 to implement the logic block 26 on the programmable logic 48 of the integrated circuit system 12. In particular, the designer may specify in a high-level program that mathematical operations such as addition and multiplication be performed. The compiler 16 may convert the high-level program into a lower-level description that is used to program the programmable logic 48 to perform the operations.

Figure 3:
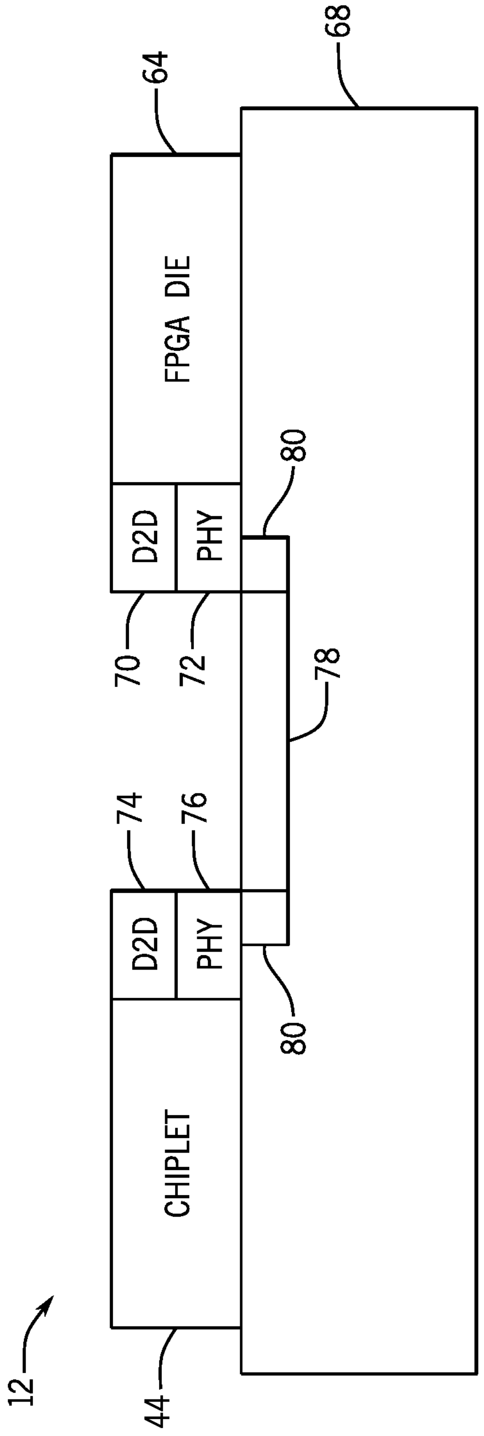
FIG. 3 is a side view of a block diagram of an example of the integrated circuit system, in accordance with an embodiment of the present disclosure.

Keeping the foregoing in mind, FIG. 3 is a block diagram of an example of the integrated circuit system 12. The integrated circuit system 12 may include a Field Programmable Gate Array (FPGA) die 64 or another programmable logic die. The integrated circuit system 12 also includes the chiplet 44 that may be communicatively coupled through die-to-die interconnect circuitry 78. The FPGA die 64 may include interconnect circuitry, among other things. For instance, the interconnect circuitry may include a die-to-die adapter layer circuitry 70 and physical layer circuitry 72.

The chiplet 44 may include a transceiver tile and interconnect circuitry, among other things. The interconnect circuitry 78 may include die-to-die adapter layer circuitry 74 and physical layer circuitry 76. The interconnect circuitry 78 may be implemented through a substrate 68. Additionally or alternatively, the interconnect circuitry 78 may be implemented through an interposer medium, such as a silicon interposer medium. The physical layer circuitry 72 may connect to an Embedded Multi-die Interconnect Bridge (EMIB) 80 or other suitable packaging circuitry that is embedded into the substrate 68 and connected to the physical layer circuitry 72, such as through wires connecting microbumps. The interconnect circuitry 78 may also be implemented according to an interconnect standard for die-to-die data communication onto the EMIB 17.

Although the integrated circuit system 12 is illustrated as containing the chiplet 44 and the FPGA die 64, the integrated circuit system 12 may include any combination of dies, chips, or chiplets. Similarly, the interconnect circuitries may include any interconnect circuitry technologies.

Furthermore, chiplets may be defined as digitally communicative dies (e.g., sometimes referred to as chips). Some chiplets may be integrated circuits equipped with transceivers or transceiver dies. Chiplets may be grouped as one or multiple dies. Chiplets may be interconnected to form a multi-die chiplet package implemented on a chip package substrate. Multiple chiplets may reside inside a packaging boundary of a chip. Furthermore, chiplets may also be defined as digitally communicative dies with no packaging boundary in the form of a modular digital circuit, as an example, implemented on a circuit board substrate.

The die-to-die adapter layer circuitry 70, 74 and physical layer circuitry 72, 76 in FIG. 3 may provide the FPGA die 64 and the chiplet 44, with data transmission and reception interconnect circuitry to create a coherent connection between the FPGA die 64 and the chiplet 44 using Advanced Interconnect Bus (AIB) (or any other suitable connection protocol, such as Universal Chiplet Interconnect Express (UCIe) or Universal Interconnect Bus (UIB)). The AIB (or other protocol) is a physical level interface protocol that may define the interface of a digital die in order for communication with other chiplets. Multiple dies or chiplets may be equipped with the AIB interconnect protocol or the like, enabling the multiple dies to be interconnected through the EMIB 80.

The die-to-die adapter layer circuitry 70, 74, physical layer circuitry 72, 76, and interconnect circuitry 78 of FIG. 1 may form a first communicative embodiment using one or more AIB interconnect protocols where more than one chiplet or communicative dies are communicatively coupled. The die-to-die adapter layer circuitry 70, 74 may be compatible and able to communicate using a data protocol common to the die-to-die adapter layer circuitry 70, 74. Interconnect circuitry 78 (e.g., die-to-die layer, physical layer, and so forth) may be implemented into respective chiplets to use features by the common protocol. For example, the protocol (e.g., AIB 1.0) may specify a full swing voltage level (e.g., 0.9 V), a transmission frequency bandwidth (e.g., 2 Gbps), a specific time-division multiplexing setup, a communication protocol, a single data rate, and a specific physical pinout from a die, among other things. In such situations, the interconnection circuitry of chiplets that are communicatively coupled to one another may include interfaces that communicate using the common settings.

Figure 4:
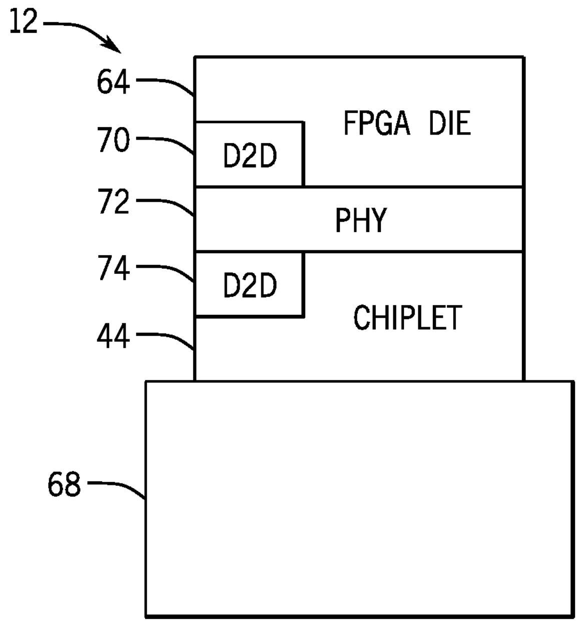
FIG. 4 is side view of a block diagram of another example of the integrated circuit system, in accordance with an embodiment of the present disclosure.
Figure 5:
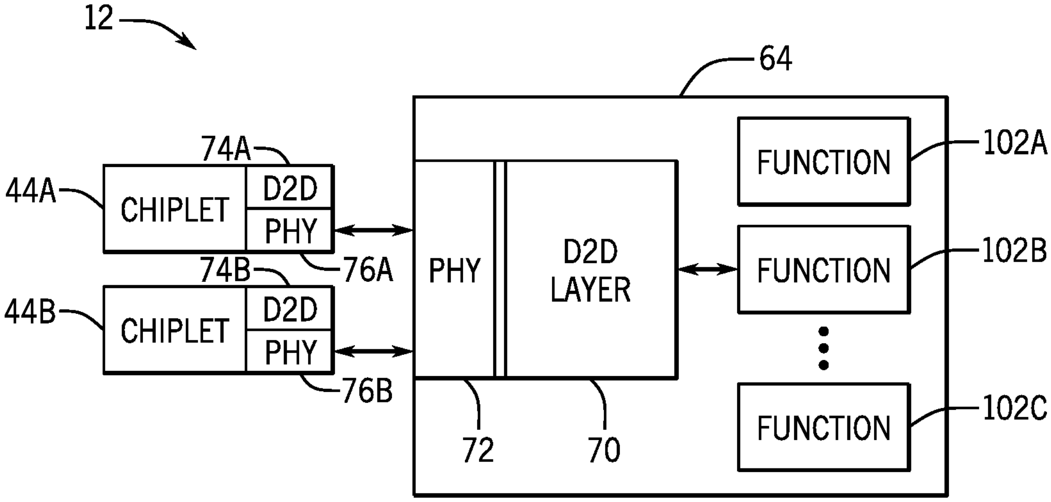
FIG. 5 is a block diagram of an integrated circuit system based on a circuit design agnostic of physical layer circuitry, in accordance with an embodiment of the present disclosure.

In the example of FIG. 4, the integrated circuit system 12 includes the chiplet 44 mounted on the substrate 68 and the FPGA die 64 mounted on the chiplet 44. There may be further layers of chiplets, dies, or tiles in other examples. The physical layer circuitry 72 may facilitate signal transfer (e.g., die-to-die communication) between the FPGA die 64 and the chiplet 44. By way of example, the physical layer circuitry 72 may operate in the manner of an Embedded Multi-Die Interconnect Bridge (EMIB) by Intel Corporation. In general, any suitable number and arrangement of chiplets 44 may be mounted on the substrate 68 and/or a layer of chiplets 44 above the substrate 68. Additionally or alternatively, the integrated circuit system 12 may include the FPGA die 64 mounted on the substrate 68 and the chiplet 44 mounted on the FPGA With the foregoing in mind, FIG. 5 is a block diagram of the integrated circuit system 12 including multiple chiplets 44A, 44B that communicate via the physical layer circuitry 72. The first chiplet 44A may be a first type of chiplet, such as a memory chiplet, DSP chiplet, transceiver chiplet, HPS chiplet, and so forth. The first chiplet 44A may include die-to-die adapter layer circuitry 74A and physical layer circuitry 76A. In certain embodiments, the first chiplet 44A may communicate via a first communication protocol, such as Peripheral Component Interconnect Express (PCIe) communication protocol. The second chiplet 44B may be a second type of chiplet and may include the die-to-die adapter layer circuitry 74B and physical layer circuitry 76B. In certain embodiments, the first chiplet 44A and the second chiplet 44B may include the same type of chiplet, such as a transceiver chiplet. Additionally or alternatively, the second chiplet 44B may communicate via a second communication protocol. In some embodiments, the second communication protocol and the first communication protocol may be the same communication protocol, such as PCIe. In some embodiments, the design software 14 may utilize different interconnect resources to model the connections between the different chiplets 44A, 44B and the FPGA die 64. However, by separating out the physical layer circuitry 72 from modelling by the design software 14, any number of chiplets 44A, 44B may be communicatively coupled with the FPGA die 64 without separate modeling of the interconnect resources. Accordingly, an interface between the die-to-die adapter layer 70 and the physical layer circuitry 72 may be modular. That is, the interface between the die-to-die adapter layer 70 and the physical layer circuitry 72 may be channel-to-channel. As such, the physical layer circuitry 72 may be independent from the die-to-die adapter layer 70 and vice-versa. That is, the physical layer circuitry 72 may be decoupled from the die-to-die adapter layer 70. As such, the physical layer circuitry 72 may be upgraded and/or modified without changing the die-to-die adapter layer 70.

The design software 14 may model the circuit design agnostic of the physical layer circuitry 72. As such, the design software 14 may model the circuit design without modeling the physical layer circuitry 72. Additionally or alternatively, the design software 14 may model a first design associated with the first chiplet 44A without modeling the physical layer circuitry 72 and may also model a second design associated with the second chiplet 44B without modeling the physical layer circuitry 72. Accordingly, by separating out the physical layer circuitry 72 from modelling by the design software 14, time and resources may be reduced during programming of the FPGA die 64. Additionally, by separating out the physical layer circuitry 72 from modelling by the design software 14, the design software 14 may configure any number of circuit designs corresponding to any number of chiplets 44. For example, the design software may configure programmable logic of the FPGA die 64 for a first circuit design that corresponds to a custom chiplet manufactured by a vendor. Additionally or alternatively, the first chiplet 44A may be provided by a first manufacturer and/or vendor and the design software 14 may be provided by a second manufacturer and/or vendor. As such, the design software 14 may permit programming the programmable logic of the FPGA die 64 to communicatively couple to various chiplets provided by various manufacturers and/or vendors. Moreover, a manufacturer and/or vendor associated with the FPGA die 64 may differ from the manufacturer and/or vendor associated with the first chiplet 44A, the second chiplet 44B, or both.

The die-to-die adapter layer 70 may map any number of functions, such as functions 102A, 102B, 102C (referred to collectively as functions 102), to perform tasks. For example, the functions 102 may include a streaming function that may stream data across the FPGA die 64, a first in first out (FIFO) function, a scrambling function, an Ethernet function, an analog to digital converter (ADC) function, and so forth. The functions 102 may perform any number of tasks on the FPGA die 64.

Figure 6:
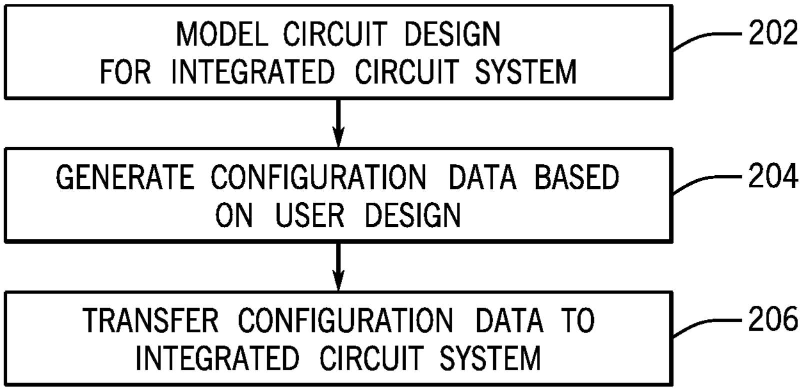
FIG. 6 is a flowchart of a method for configuring circuitry based on configuration data, in accordance with an embodiment of the present disclosure.

FIG. 6 is an example method 200 for manufacturing the integrated circuit system 12. A designer and/or design software 14 may model a circuit design for the integrated circuit system (block 202). For example, the designer may use design software 14, such software such as Quartus® by Intel Corporation to develop the circuit design. The design software 14 may determine the resources involved to support the circuit design. For example, the software may identify the amount of programmable logic fabric to be used, the number of DSP blocks, the number of memory blocks, and the like. In certain embodiments, the design software 14 may model the circuit design agnostic of the physical layer circuitry of the integrated circuit system. For example, the design software 14 may not model the physical layer circuitry of the FPGA die 64. Based on the resources to be used by the user design, the design software 14 may generate configuration data (block 204) describing the user design. The design software may also place and route the user design. For example, the design software 14 may transfer (block 206) the configuration data to the integrated circuit system 12 to implement the user design (e.g., circuit design). The configuration data may cause the programmable logic fabric of the integrated circuit system (e.g., the FPGA die 64) to implement the circuit design.

The method 200 includes various steps represented by blocks. Although the flow chart illustrates the steps in a certain sequence, it should be understood that the steps may be performed in any suitable order and certain steps may be carried out simultaneously, where appropriate. Further, certain steps or portions of the method 200 may be performed by separate systems or devices.

Figure 7:
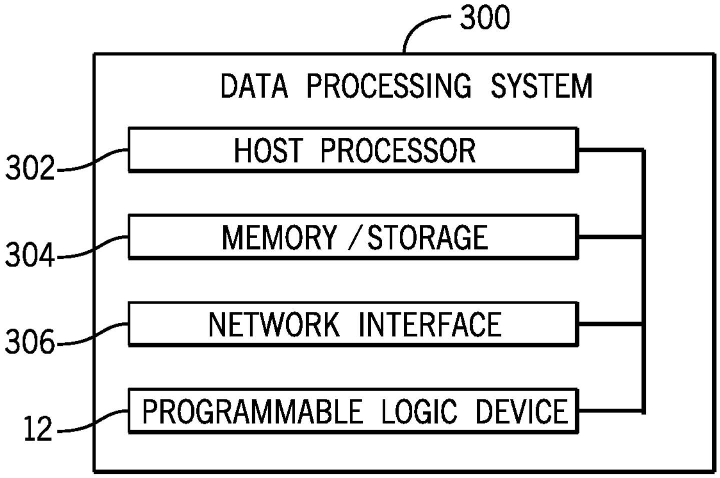
FIG. 7 is a block diagram of a data processing system where one or more logic blocks may be implemented, in accordance with an embodiment of the present disclosure.

The integrated circuit system 12 may be a component included in a data processing system, such as a data processing system 300, shown in FIG. 7. The data processing system 300 may include the integrated circuit system 12 (e.g., a programmable logic device with chiplet packages), a host processor 302, memory and/or storage circuitry 304, and a network interface 306. The data processing system 300 may include more or fewer components (e.g., electronic display, user interface structures, application specific integrated circuits (ASICs)). Moreover, any of the circuit components depicted in FIG. 7 may include integrated circuit system 12. The host processor 302 may include any of the foregoing processors that may manage a data processing request for the data processing system 300 (e.g., to perform encryption, decryption, machine learning, video processing, voice recognition, image recognition, data compression, database search ranking, bioinformatics, network security pattern identification, spatial navigation, cryptocurrency operations, or the like). The memory and/or storage circuitry 304 may include random access memory (RAM), read-only memory (ROM), one or more hard drives, flash memory, or the like. The memory and/or storage circuitry 304 may hold data to be processed by the data processing system 300. In some cases, the memory and/or storage circuitry 304 may also store configuration programs (bitstreams) for programming the integrated circuit system 12. The network interface 306 may allow the data processing system 300 to communicate with other electronic devices. The data processing system 300 may include several different packages or may be contained within a single package on a single package substrate. For example, components of the data processing system 300 may be located on several different packages at one location (e.g., a data center) or multiple locations. For instance, components of the data processing system 300 may be located in separate geographic locations or areas, such as cities, states, or countries.

In one example, the data processing system 300 may be part of a data center that processes a variety of different requests. For instance, the data processing system 300 may receive a data processing request via the network interface 306 to perform encryption, decryption, machine learning, video processing, voice recognition, image recognition, data compression, database search ranking, bioinformatics, network security pattern identification, spatial navigation, digital signal processing, or some other specialized task.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments

EXAMPLE EMBODIMENT 1. An article of manufacture comprising one or more tangible, non-transitory, machine-readable media having instructions stored thereon that, when executed by one or more processors, cause the one or more processors to:

model a circuit design for an integrated circuit system, wherein the circuit design is agnostic of physical layer circuitry of the integrated circuit system;

generate configuration data based on the circuit design; and transfer the configuration data to the integrated circuit system to cause programmable logic of the integrated circuit system to implement the circuit design.

EXAMPLE EMBODIMENT 2. The article of manufacture of example embodiment 1, wherein the instructions, when executed by the one or more processors, cause the one or more processors to model the circuit design without modeling the physical layer circuitry.

EXAMPLE EMBODIMENT 3. The article of manufacture of example embodiment 1, wherein the instructions, when executed by the one or more processors, cause the one or more processors to model the circuit design with a die-to-die adapter layer.

EXAMPLE EMBODIMENT 4. The article of manufacture of example embodiment 3, wherein the die-to-die adapter layer includes circuitry comprising advanced interface bus (AIB) circuitry, universal interconnect bus (UIB) circuitry, or both.

EXAMPLE EMBODIMENT 5. The article of manufacture of example embodiment 1, wherein the circuit design is associated with a first chiplet configurable to communicatively couple to an integrated circuit die of the integrated circuit system.

EXAMPLE EMBODIMENT 6. The article of manufacture of example embodiment 5, wherein the integrated circuit die comprises the programmable logic.

EXAMPLE EMBODIMENT 7. The article of manufacture of example embodiment 5, wherein the instructions, when executed by the one or more processors, cause the one or more processors to:

model a second circuit design for the integrated circuit system, wherein the second circuit design is associated with a second chiplet configurable to communicatively couple to the integrated circuit die.

EXAMPLE EMBODIMENT 8. The article of manufacture of example embodiment 7, wherein the integrated circuit die comprises the physical layer circuitry.

EXAMPLE EMBODIMENT 9. The article of manufacture of example embodiment 7, wherein the instructions, when executed by the one or more processors, cause the one or more processors to model the second circuit design without modeling the physical layer circuitry.

EXAMPLE EMBODIMENT 10. An integrated circuit system, comprising:

a chiplet; and an integrated circuit die communicatively coupled to the chiplet, the integrated circuit die comprising programmable logic fabric configurable to implement a circuit design, wherein the integrated circuit die receives configuration data based on the circuit design, and wherein the circuit design does not model physical layer circuitry associated with the integrated circuit die.

EXAMPLE EMBODIMENT 11. The integrated circuit system of example embodiment 10, wherein the chiplet comprises a custom chiplet.

EXAMPLE EMBODIMENT 12. The integrated circuit system of example embodiment 11, wherein the integrated circuit die is associated with a first manufacturer and the custom chiplet is associated with a second manufacturer.

EXAMPLE EMBODIMENT 13. The integrated circuit system of example embodiment 12, comprising:

a first chiplet configurable to communicatively couple to the integrated circuit die; and a second chiplet configurable to communicatively couple to the integrated circuit die.

EXAMPLE EMBODIMENT 14. The integrated circuit system of example embodiment 13, wherein:

the integrated circuit die is configurable to implement a first circuit design associated with the first chiplet and agnostic of the physical layer circuitry of the integrated circuit die; and the integrated circuit die is configurable to implement a second circuit design associated with the second chiplet and agnostic of the physical layer circuitry of the integrated circuit die.

EXAMPLE EMBODIMENT 15. The integrated circuit system of example embodiment 13, wherein the first chiplet is associated with a first manufacturer and the second chiplet is associated with a second manufacturer.

EXAMPLE EMBODIMENT 16. The integrated circuit system of example embodiment 13, wherein the first chiplet is associated with a first manufacturer and the integrated circuit die is associated with a second manufacturer.

EXAMPLE EMBODIMENT 17. A method of preparing an integrated circuit, comprising:

generating configuration data based on a user design for an integrated circuit system that is independent of physical layer circuitry of an integrated circuit die of the integrated circuit system; and transferring the configuration data to the integrated circuit system to cause a portion of programmable logic of the integrated circuit die to implement the user design.

EXAMPLE EMBODIMENT 18. The method of example embodiment 17, wherein the user design is associated with a first chiplet configurable to communicatively couple to the integrated circuit die via the physical layer circuitry.

EXAMPLE EMBODIMENT 19. The method of example embodiment 18, comprising:

generating second configuration data based on a second user design associated with a second chiplet, wherein the second user design is independent of the physical layer circuitry; and transferring the second configuration data to the integrated circuit system to cause a second portion of programmable logic of the integrated circuit die to implement the second user design.

EXAMPLE EMBODIMENT 20. The method of example embodiment 18, wherein the first chiplet is associated with a first manufacturer and the integrated circuit die is associated with a second manufacturer.

What is claimed is:

1. An article of manufacture comprising one or more tangible, non-transitory, machine-readable media having instructions stored thereon that, when executed by one or more processors, cause the one or more processors to:

model a circuit design for an integrated circuit system, wherein the circuit design is modelled independent of modelling circuitry of physical layer circuitry of the integrated circuit system;

generate configuration data based on the circuit design; and transfer the configuration data to the integrated circuit system to cause programmable logic of the integrated circuit system to implement the circuit design.

2. The article of manufacture of claim 1, wherein the instructions, when executed by the one or more processors, cause the one or more processors to model the circuit design with a die-to-die adapter layer, wherein an interface between the die-to-die adapter layer and the physical layer circuitry is modular.

3. The article of manufacture of claim 2, wherein the die-to-die adapter layer includes circuitry comprising advanced interface bus (AIB) circuitry, universal interconnect bus (UIB) circuitry, or both.

4. The article of manufacture of claim 1, wherein the circuit design is associated with a first chiplet of the integrated circuit system configurable to communicatively couple to an integrated circuit die of the integrated circuit system.

5. The article of manufacture of claim 4, wherein the integrated circuit die comprises the programmable logic.

6. The article of manufacture of claim 4, wherein the instructions, when executed by the one or more processors, cause the one or more processors to:

model a second circuit design for the integrated circuit system, wherein the second circuit design is associated with a second chiplet configurable to communicatively couple to the integrated circuit die.

7. The article of manufacture of claim 6, wherein the integrated circuit die comprises the physical layer circuitry.

8. The article of manufacture of claim 6, wherein the instructions, when executed by the one or more processors, cause the one or more processors to model the second circuit design without modeling the physical layer circuitry.

9. The article of manufacture of claim 1, wherein the instructions, when executed by the one or more processors, cause the one or more processors to model the circuit design based on modelling data routing between the integrated circuit system and a first chiplet.

10. An integrated circuit system, comprising:

a chiplet; and an integrated circuit die configurable to communicatively couple to the chiplet, the integrated circuit die comprising programmable logic fabric configurable to implement a circuit design, wherein the integrated circuit die receives configuration data based on the circuit design, wherein the circuit design is to be modelled separate from modelling of circuitry of physical layer circuitry associated with the integrated circuit die.

11. The integrated circuit system of claim 10, wherein the chiplet comprises a custom chiplet.

12. The integrated circuit system of claim 11, wherein the integrated circuit die is associated with a first manufacturer and the custom chiplet is associated with a second manufacturer.

13. The integrated circuit system of claim 12, comprising:

a first chiplet configurable to communicatively couple to the integrated circuit die; and a second chiplet configurable to communicatively couple to the integrated circuit die.

14. The integrated circuit system of claim 13, wherein:

the integrated circuit die is configurable to implement a first circuit design associated with the first chiplet and independent of the physical layer circuitry of the integrated circuit die; and the integrated circuit die is configurable to implement a second circuit design associated with the second chiplet and independent of the physical layer circuitry of the integrated circuit die.

15. The integrated circuit system of claim 13, wherein the first chiplet is associated with a first manufacturer and the second chiplet is associated with a second manufacturer.

16. The integrated circuit system of claim 13, wherein the first chiplet is associated with a first manufacturer and the integrated circuit die is associated with a second manufacturer.

17. A method of preparing an integrated circuit, comprising:

generating configuration data based on a user design for an integrated circuit system that is to be modelled independent of modelling of circuitry of physical layer circuitry of an integrated circuit die of the integrated circuit system; and transferring the configuration data to the integrated circuit system to cause a portion of programmable logic of the integrated circuit die to implement the user design.

18. The method of claim 17, wherein the user design is associated with a first chiplet configurable to communicatively couple to the integrated circuit die via the physical layer circuitry.

19. The method of claim 18, comprising:

generating second configuration data based on a second user design associated with a second chiplet, wherein the second user design is independent of the physical layer circuitry; and transferring the second configuration data to the integrated circuit system to cause a second portion of programmable logic of the integrated circuit die to implement the second user design.

20. The method of claim 18, wherein the first chiplet is associated with a first manufacturer and the integrated circuit die is associated with a second manufacturer.

* * * * *